(12) United States Patent
Etou

(10) Patent No.: US 7,893,729 B2
(45) Date of Patent: Feb. 22, 2011

(54) VOLTAGE/CURRENT CONVERSION CIRCUIT

(75) Inventor: Toshiyuki Etou, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/555,551

(22) Filed: Sep. 8, 2009

(65) Prior Publication Data

US 2010/0060324 A1    Mar. 11, 2010

(30) Foreign Application Priority Data

Sep. 8, 2008    (JP)    ............................. 2008-229601

(51) Int. Cl.
*H03F 3/45*    (2006.01)
(52) U.S. Cl. .................... 327/103; 327/96; 327/337; 327/345
(58) Field of Classification Search .................. 327/103, 327/96, 337, 344, 345, 554
See application file for complete search history.

(56) References Cited

U.S. PATENT DOCUMENTS 5,815,390 A * 9/1998 Lakshmikumar ............. 363/73

7,663,409 B2 * 2/2010 Singnurkar .................. 327/103
2009/0096490 A1 * 4/2009 Kuo et al. .................... 327/103

OTHER PUBLICATIONS

Yasuhiro Sugimoto et al., "A 35MS/s and 2V/2.5V Current-mode Sample-and-Hold Circuit with an Input Current Linearization Technique", Asian solid-state circuits conferences, Paper No. P2-20, Nov. 2005 (IEEE), pp. 445-448.

* cited by examiner

*Primary Examiner*—Tuan Lam
(74) *Attorney, Agent, or Firm*—Young & Thompson

(57) ABSTRACT

Provided is voltage/current conversion circuit including: first and second capacitors; first and second resistors each connected to input terminal; first and second current sources; third and fourth resistors connected to current sources; differential amplifier for controlling the current sources; control unit for performing control, in first state, the input terminal is connected to the first and second capacitors; one input of the differential amplifier is connected to the first resistor and output of the first current source; the other input of the differential amplifier is connected to the second resistor and output of the second current source, and in second state, the second capacitor is connected between the output of the first current source and the one input of the differential amplifier, the first capacitor is connected between the output of the second current source and the other input of the differential amplifier.

12 Claims, 6 Drawing Sheets

HOLD MODE

VOLTAGE/CURRENT CONVERSION CIRCUIT

BACKGROUND

1. Field of the Invention

The present invention relates to a voltage/current conversion circuit.

2. Description of Related Art

Reference is now made to FIG. 5 which illustrates the configuration of a sampling-type voltage/current conversion circuit 1 disclosed in "A 35 MS/s and 2V/2.5V Current-mode Sample-and-Hold Circuit with an Input Current Linearization Technique", Asian solid-state circuits conference, 2005 (IEEE), Paper No. P2-20, pp. 445 to 448, as an example of conventional voltage/current conversion circuits. As shown in FIG. 5, the voltage/current conversion circuit 1 includes resistors R11 and R21, current sampling circuits 11 and 21, current mirror circuits 12 and 22, and a sampling error correction circuit 30. Input terminals IN1 and IN2 of the voltage/current conversion circuit 1 are each connected to an input signal source to receive an input signal Vin. It is assumed herein that a voltage input to the input terminal IN1 is denoted by Vin1 and a voltage input to the input terminal IN2 is denoted by Vin2.

The resistor R11 is connected between the input terminal IN1 and the current sampling circuit 11. The resistor R21 is connected between the input terminal IN2 and the current sampling circuit 21. Each of the resistors R11 and R12 has a function of converting an input voltage into a current in the voltage/current conversion circuit 1.

The current sampling circuit 11 includes transistors M11 to M13, an amplifier G11, a sampling capacitor C11, a switch SW11, and a constant current source CC11. The current sampling circuit 21 includes transistors M21 to M23, an amplifier G21, a sampling capacitor C21, a switch SW21, and a constant current source CC21.

The current mirror circuit 12 includes transistors M14 and M15, an amplifier G12, and constant current sources CC12 and CC13. The current mirror circuit 22 includes transistors M24 and M25, an amplifier G22, and constant current sources CC22 and CC23. The drains of the transistors M15 and M25 are connected to output terminals OUT1 and OUT2, respectively.

To achieve pseudo differential operation, the current sampling circuits 11 and 21 have the same configuration, and the current mirror circuits 12 and 22 have the same configuration.

The sampling error correction circuit 30 includes transistors M31 and M32, and a constant current source CC31. Note that the constant current sources CC11 to CC31 are bias-use constant current sources.

The operation of the above-mentioned voltage/current conversion circuit 1 will be briefly described. Since the current sampling circuits 11 and 21 have the same configuration and the current mirror circuits 12 and 22 have the same configuration, only the operation of each of the current sampling circuit 11 and the current mirror circuit 12 is herein described.

First, the input impedance of the current sampling circuit 11 is lowered, because the amplifier G11 has a large gain. Further, the finite input impedance of the current sampling circuit 11 is corrected by the sampling error correction circuit 30. Thus, the potential at a node A1 is adjusted by the amplifier G11, the transistor M11, and the sampling error correction circuit 30 so as to be held constant at a ground potential GND irrespective of the input voltage Vin1. Accordingly, a current input to the current sampling circuit 11 has a value obtained by dividing substantially ideally the input voltage Vin1 by the resistor R11.

The switch SW11 receives a clock signal CLK as shown in FIG. 6. The switch SW11 is driven by the clock signal CLK. The switch SW11 is turned on when the clock signal CLK is at high level as shown in a time period S1 between a time t1 and a time t2, for example, and the current sampling circuit 11 enters a sampling mode. Further, as shown in a time period H1 between the time t2 and a time t3, the switch SW11 is turned off when the clock signal CLK is at low level, and the current sampling circuit 11 enters a hold mode.

In the sampling mode (when the switch SW11 is in the ON state), a node B1 is connected to each of the sampling capacitor C11 and the gates of the transistors M12 and M13. As a result, the gate-source voltage of each of the transistors M11 to M13 is held as the charging voltage of the sampling capacitor C11. The voltage/current conversion circuit 1 outputs a current, which is sampled by the gate-source voltage of the transistor M12 obtained at this time, i.e., the voltage at the node B1, as an output current Iout1 from the output terminal OUT1 via the next-stage current mirror circuit 12.

In the hold mode (when the switch SW11 is in the OFF state), the node B1 is disconnected from the sampling capacitor C11 and from the gates of the transistors M12 and M13. As a result, the transistors M12 and M13 are driven by the hold voltage of the sampling capacitor C11 at the time of switching from the sampling mode to the hold mode. Accordingly, the voltage/current conversion circuit 1 outputs a current, which is sampled by the hold voltage of the sampling capacitor C11 obtained at this time, as the output current Iout1 from the output terminal OUT1 via the next-stage current mirror circuit 12. Meanwhile, an output current Iout2 is output from the output terminal OUT2. The output currents Iout1 and Iout2 are in a differential relationship, and are output as differential signals from the output terminals OUT1 and OUT2.

The drains of the transistors M13 and M23 are connected to the output terminals OUT2 and OUT1, respectively, so as to cancel the charge injection effect from the switches SW11 and SW21.

SUMMARY

As described above, since the voltage/current conversion is performed by the resistor R11, the voltage/current conversion circuit 1 is configured such that the potential at the node A1 is adjusted by the amplifier G11 and the transistor M11 of the current sampling circuit 11 so as to be held constant. Further, the amplifier G11 also charges the sampling capacitor. Note that the operation of the current sampling circuit 21 is similar to that of the current sampling circuit 11.

In this regard, the present inventor has found the following problem. In general, amplifiers have a frequency response. As the frequency of the input signal increases, the gain of the amplifier G11 decreases. When the input signal has a low frequency, the amplifier G11 performs the above-mentioned operation with accuracy. When the input signal has a high frequency, however, it is difficult for the amplifier G11 to perform an operation for the voltage/current conversion to follow the input signal voltage with accuracy during the sampling period S1 shown in FIG. 6, and to charge the sampling capacitor. Moreover, when the sampling frequency increases, the sampling period is shortened, which makes it more difficult to carry out the above-mentioned operation.

In order to solve the above-mentioned problem, it is necessary for the current sampling circuits 11 and 21 and the sampling error correction circuit 30 to complete settling fast.

For example, the amplifier G11 and the like may be designed to amplify a high-frequency input signal. In the amplifier for amplifying the high-frequency signal, however, a bias current inevitably increases, resulting in an increase in power consumption. This makes it difficult to reduce the power consumption of the voltage/current conversion circuit.

A first exemplary aspect of an embodiment of the present invention is a voltage/current conversion circuit which outputs a differential output current signal corresponding to a potential difference between differential input signals respectively input to a first input terminal and a second input terminal, the voltage/current conversion circuit including: a first capacitor and a second capacitor; a first resistor having one terminal connected to the first input terminal; a second resistor having one terminal connected to the second input terminal; a first current source that outputs a current in response to a first control signal; a second current source that outputs a current in response to a second control signal; a first output terminal and a second output terminal that output currents respectively corresponding to the currents output from the first current source and the second current source; a third resistor connected to an output of the first current source; a fourth resistor connected to an output of the second current source; a differential amplifier that outputs the first control signal and the second control signal for respectively controlling the currents output from the first current source and the second current source in accordance with a potential different between one input and the other input; and a control unit that performs a control such that: in a first state, the first input terminal is connected to one terminal of the first capacitor; the second input terminal is connected to one terminal of the second capacitor; one input of the differential amplifier is connected to the other input terminal of the first resistor; the other input of the differential amplifier is connected to the other terminal of the second resistor; the output of the first current source is connected to the other input of the differential amplifier; and the output of the second current source is connected to the one input of the differential amplifier, and in a second state, the first capacitor is connected between the output of the first current source and the other input of the differential amplifier, and the second capacitor is connected between the output of the second current source and the one input of the differential amplifier.

In the voltage/current conversion circuit according to an exemplary embodiment of the present invention, in the first state, the sampling of the input signal voltage is carried out with high accuracy using the first and second capacitors serving as passive elements, and the voltage/current conversion is performed to follow the input signal by using the first and second resistors for determining a voltage/current conversion ratio. In the second state, the differential output current is determined based on a sampling voltage of each of the first and second capacitors at the time of switching from the first state, and each of the third and fourth resistors for determining the voltage/current conversion ratio. Though the differential amplifier has a predetermined operation delay, the voltage/current conversion circuit is capable of correcting the delay even in the second state. Further, the correction can be achieved at high speed, because the output difference of the differential amplifier caused due to the correction is small. Therefore, the voltage/current conversion circuit requires no high-speed amplifier for amplifying a high-speed input signal which requires high power consumption.

A voltage/current conversion circuit according to an exemplary embodiment of the present invention is capable of using an amplifier having low power consumption even when the input signal has a high-frequency, and of suppressing an increase in power consumption.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Specific embodiments to which the present invention is applied will be described in detail below with reference to the accompanying drawings. In this exemplary embodiment, the present invention is applied to a sampling-type voltage/current conversion circuit 100.

First Exemplary Embodiment

Figure 1:
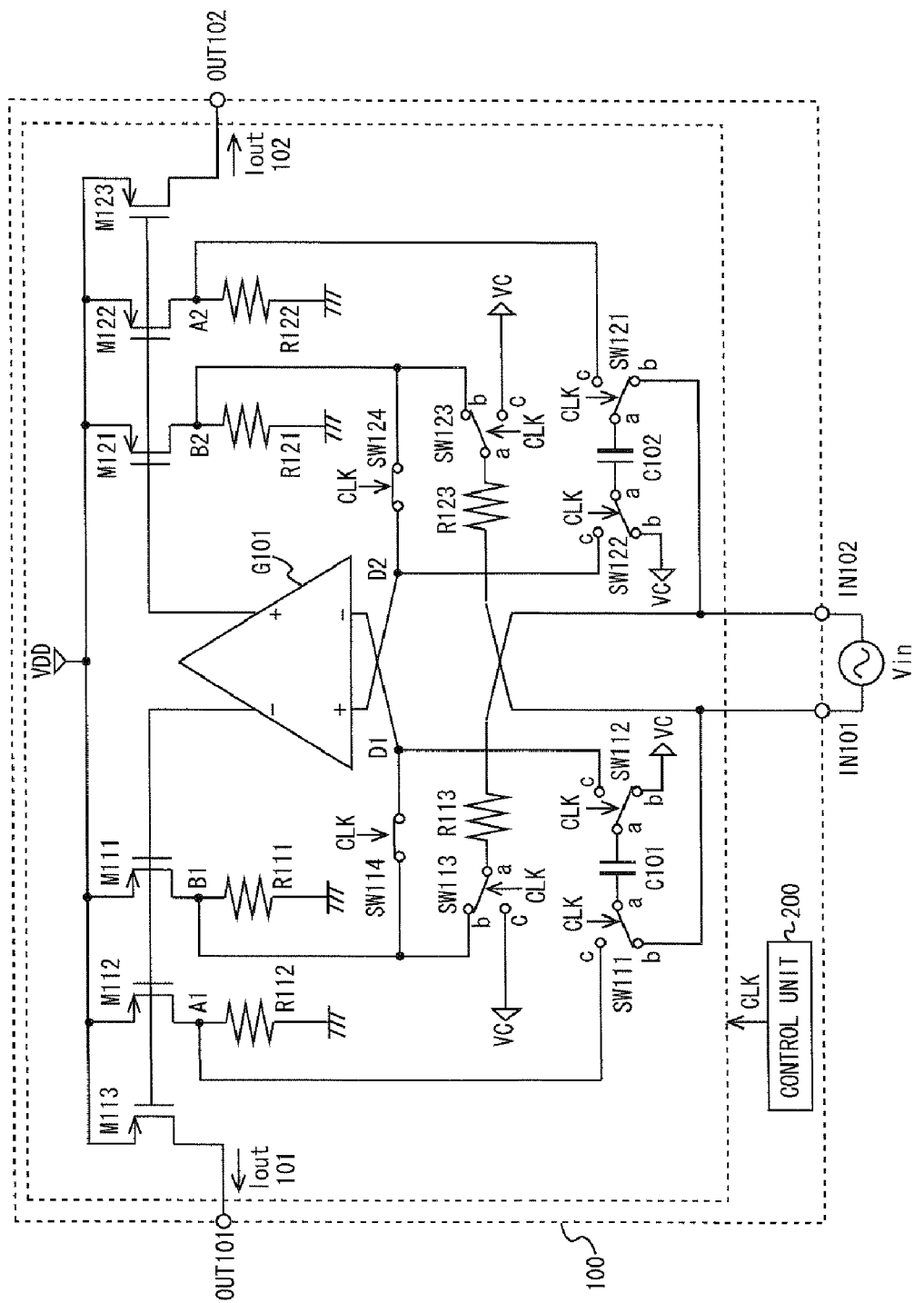
FIG. 1 shows a configuration example of a voltage/current conversion circuit according to a first exemplary embodiment of the present invention.

FIG. 1 shows a configuration example of the voltage/current conversion circuit 100 according to this exemplary embodiment. As shown in FIG. 1, the voltage/current conversion circuit 100 includes an amplifier G101, capacitors C101 and C102, PMOS transistors M111 to M113 and M121 to M123, resistors R111 to R113 and R121 to R123, switches SW111 to SW114 and SW121 to SW124, a control unit 200, input terminals IN101 and IN102, and output terminals OUT101 and OUT102.

The input terminals IN101 (first input terminal) and IN102 (second input terminal) are each connected to an external signal source for outputting a high-frequency signal (e.g., 10 MHz). Thus, each of the input terminals IN101 and IN102 receives an input signal voltage Vin output from the external signal source.

The control unit 200 outputs a clock signal CLK to each of the switches SW111 to SW114 and SW121 to SW124. In response to the clock signal CLK, the voltage/current conversion circuit 100 switches between a sampling mode (first state) and a hold mode (second state). The term "sampling mode" herein described refers to a state where a differential output current corresponding to a differential input signal is output to follow the change of the input signal. Further, the term "hold mode" herein described refers to a state where a differential output current at the time of switching from the sampling mode to the hold mode is held constant.

The switches SW111 to SW113 and SW121 to SW123 are three-terminal switches and have terminals "a", "b", and "c". The connections of the switches SW111 to SW113 and SW121 to SW123 are controlled in response to the clock signal CLK shown in FIG. 2. In this exemplary embodiment, when the clock signal CLK is at high level, the terminals "a" and "b" are connected to each other, and when the clock signal CLK is at low level, the terminals "a" and "c" are connected to each other.

The switch SW111 has the terminal "a" connected to one end of the capacitor C101, the terminal "b" connected to the input terminal IN101, and the terminal "c" connected to a node A1. The switch SW121 has the terminal "a" connected to one end of the capacitor C102, the terminal b connected to the input terminal IN102, and the terminal "c" connected to a node A2.

The switch SW112 has the terminal "a" connected to the other end of the capacitor C101, the terminal "b" connected to a constant voltage supply terminal VC, and the terminal "c" connected to a node D1. The switch SW122 has the terminal "a" connected to the other end of the capacitor C102, the terminal "b" connected to the constant voltage supply terminal VC, and the terminal "c" connected to a node D2. The constant voltage supply terminal VC is supplied with a predetermined voltage, e.g., a midpoint potential of the amplitude level of the input signal Vin.

The switch SW113 has the terminal "a" connected to one end of the resistor R113, the terminal "b" connected to a node B1, and the terminal "c" connected to the constant voltage supply terminal VC. The switch SW123 has the terminal "a" connected to one end of the resistor R123, the terminal "b" connected to a node B2, and the terminal "c" connected to the constant voltage supply terminal VC.

The switches SW114 and SW124 are two-terminal switches, and turning on/off of the switches is controlled in response to the clock signal CLK. In this exemplary embodiment, when the clock signal CLK is at high level, the switches are turned on, and when the clock signal CLK is at low level, the switches are turned off. The switch SW114 has one end connected to the node D1 and the other end connected to the node B1. The switch SW124 has one end connected to the node D2 and the other end connected to the node B2.

The capacitor C101 (first capacitor) has one end connected to the terminal "a" of the switch SW111 and the other end connected to the terminal "a" of the switch SW112. The capacitor C102 (second capacitor) has one end connected to the terminal "a" of the switch SW121 and the other end connected to the terminal "a" of the switch SW122. Each of the capacitors C101 and C102 functions as a sampling capacitor.

The amplifier G101 is a differential amplifier having two input terminals and two output terminals. The amplifier G101 amplifies a potential difference between the two input terminals, i.e., an inverting input terminal and a non-inverting input terminal, and outputs the amplified potential difference to the two output terminals. A terminal for outputting an output signal having the same phase as that of a signal input to the non-inverting input terminal is herein referred to as a non-inverting output terminal, and a terminal for outputting an output signal having an opposite phase is herein referred to as an inverting output terminal. The amplifier G101 has the non-inverting input terminal connected to the node D2 and the inverting input terminal connected to the node D1. Further, the amplifier G101 has the inverting output terminal connected to the gates of the PMOS transistors M111 to M113, and the non-inverting output terminal connected to the gates of the PMOS transistors M121 to M123.

The PMOS transistor M111 has a source connected to a power supply voltage terminal VDD, a drain connected to the node B1, and a gate connected to the inverting output terminal of the amplifier G101. The PMOS transistor M121 has a source connected to the power supply voltage terminal VDD, a drain connected to the node B2, and a gate connected to the non-inverting output terminal of the amplifier G101.

The PMOS transistor M112 has a source connected to the power supply voltage terminal VDD, a drain connected to the node A1, and a gate connected to the inverting output terminal of the amplifier G101. The PMOS transistor M122 has a source connected to the power supply voltage terminal VDD, a drain connected to the node A2, and a gate connected to the non-inverting output terminal of the amplifier G101.

The PMOS transistor M113 has a source connected to the power supply voltage terminal VDD, a drain connected to the output terminal OUT101, and a gate connected to the inverting output terminal of the amplifier G101. The PMOS transistor M123 has a source connected to the power supply voltage terminal VDD, a drain connected to the output terminal OUT102, and a gate connected to the non-inverting output terminal of the amplifier G101.

The PMOS transistors M111 to M113 constitute a current mirror circuit with the MOS transistor M113 used as an output. The PMOS transistor M121 to M123 constitute a current mirror circuit with the PMOS transistor M123 used as an output. Note that the PMOS transistors M111 to M113 can be regarded as a current source (first current source), because each of the PMOS transistors M111 to M113 outputs a current corresponding to an output potential (first control signal) from the inverting output terminal of the amplifier G101. Likewise, the PMOS transistors M 121 to M123 can be regarded as a current source (second current source), because each of the PMOS transistor M121 to M123 outputs a current corresponding to an output potential (second control signal) from the non-inverting output terminal of the amplifier G101.

The resistor R111 (third resistor) has one end connected to the node B1 and the other end connected to a ground voltage terminal GND. The resistor R121 (fourth resistor) has one end connected to the node B2 and the other end connected to the ground voltage terminal GND.

The resistor R112 has one end connected to the node A1 and the other end connected to the ground voltage terminal GND. The resistor R122 has one end connected to the node A2 and the other end connected to the ground voltage terminal GND.

The resistor R113 (second resistor) has one end connected to the terminal "a" of the switch SW113 and the other end connected to the input terminal IN102. The resistor R123 (first resistor) has one end connected to the terminal "a" of the switch SW123 and the other end connected to the input terminal IN101. Each of the resistors R113 and R123 functions as a voltage/current converting resistor. Note that reference symbols "VDD" and "GND" denote terminal names, and also denote a power supply voltage and a ground voltage, respectively, for convenience. Reference symbols "R111" to "R123" denote names of resistors as well as resistance values.

Figure 2:
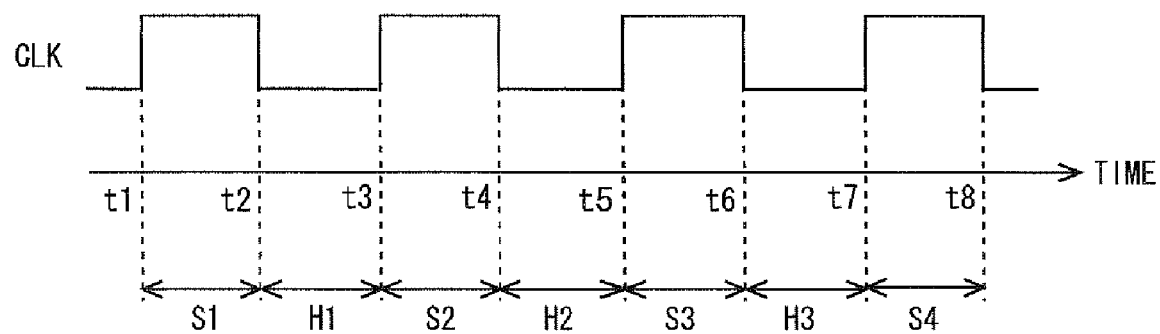
FIG. 2 shows the waveform of a clock signal input to each switch for causing the voltage/current conversion circuit according to the first exemplary embodiment to switch between a sampling mode and a hold mode.

Next, the operation of the voltage/current conversion circuit 100 according to a first exemplary embodiment of the present invention will be described in detail with reference to the drawings. FIG. 2 shows the waveform of the clock signal CLK input to each of the switches SW111 to SW114 and SW121 to SW124. In this case, the voltage/current conversion circuit 100 switches between the sampling mode and the hold mode in response to the clock signal CLK input to each of the switches SW111 to SW114 and SW121 to SW124. For example, in a time period S1 between times t1 and t2, a time period S2 between times t3 and t4, a time period S3 between times t5 and t6, and a time period S4 between times t7 and t8, as shown in FIG. 2, the clock signal CLK is at high level, and thus the voltage/current conversion circuit 100 is in the sampling mode. Meanwhile, in a time period H1 between the times t2 and t3, a time period H2 between the times t4 and t5, and a time period H3 between the times t6 and t7, as shown in FIG. 2, the clock signal CLK is at low level, and thus the voltage/current conversion circuit 100 is in the hold mode. In the sampling mode, the voltage/current conversion circuit 100 carries out sampling of the input signal voltage and a voltage/current conversion operation on the input signal voltage. In the hold mode, the voltage/current conversion circuit 100 carries out the voltage/current conversion operation on the voltage obtained by sampling the input signal. It is assumed that the resistors R111 to R113 and R121 to R123 have the same resistance value R, and the PMOS transistors M111 to M123 have the same transistor size.

Figure 3:
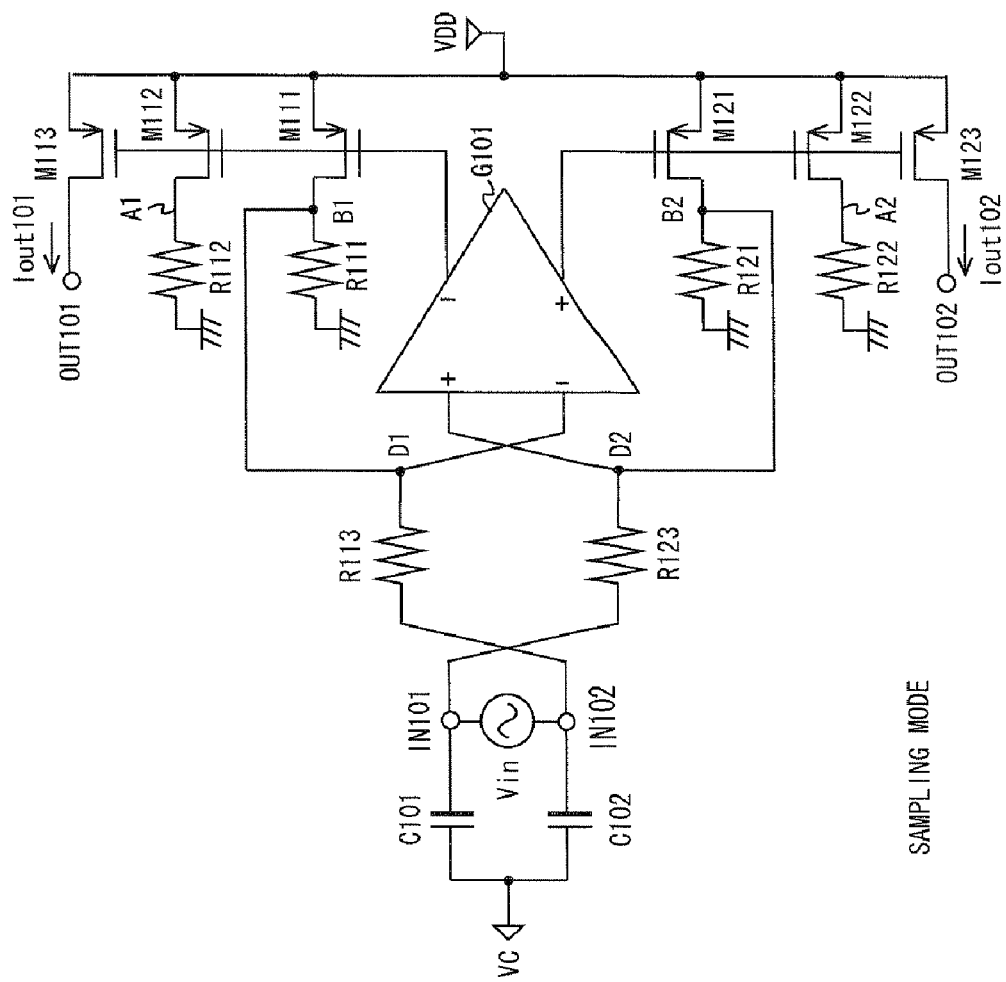
FIG. 3 is a diagram illustrating the configuration of the voltage/current conversion circuit according to the first exemplary embodiment in the sampling mode.

FIG. 3 shows the connection configuration of the voltage/current conversion circuit 100 in the sampling mode, in which the illustration of the switches SW111 to SW114 and SW121 to SW124 is omitted. The switches SW114 and SW124 are in the ON state, and thus the nodes B1 and D1 and the nodes B2 and D2 are connected to each other. The following description is given assuming that the node B1 also serves as the node D1, and the node B2 also serves as the node D2. The terminals "a" and "b" of each of the switches SW111 to SW113 and SW121 to SW123 are connected to each other, thereby connecting the capacitor C101 between the input terminal IN101 and the constant voltage supply terminal VC and connecting the capacitor C102 between the input terminal IN102 and the constant voltage supply terminal VC.

With this connection configuration, in the sampling mode (e.g., in the time period S1 between the times t1 and t2), the capacitor C101 is connected between the input terminal IN101 and the constant voltage supply terminal VC and the capacitor C102 is connected between the input terminal IN102 and the constant voltage supply terminal VC. Thus, the capacitors C101 and C102 are charged according to the input signal voltage Vin. Note that the voltage VC is a midpoint potential of the amplitude of the input signal voltage Vin. Accordingly, when the voltage applied to the input terminal IN101 has a potential higher than the voltage VC, for example, the capacitor C101 is charged with a potential difference (½ Vin) between one end and the other end thereof. Meanwhile, the capacitor C102 is charged with a potential difference (-½ Vin) between one end and the other end thereof. The capacitors C101 and C102 serve as passive elements, and are directly connected from the input terminals IN101 and IN102, respectively, which enables sampling of the input signal voltage Vin at high speed.

At the same time, the voltage/current conversion circuit 100 carries out the voltage/current conversion to follow the input signal voltage Vin by using the resistors R113 and R123. In order to carry out the voltage/current conversion, it is necessary to fix the potentials at the nodes D1 and D2. In this case, the amplifier G101 and the PMOS transistors M111 and M121 constitute a feedback circuit. The feedback circuit adjusts the amplifier G101 and the PMOS transistors M111 and M121 so that the potentials at the nodes D1 and D2 are kept constant at the voltage VC.

In other words, a current flowing through the resistors R113 and R123 changes in accordance with the input signal voltage Vin. At the same time, the output of the amplifier G101 changes and the drain current of each of the PMOS transistors M111 and M121 also changes. Even when the current flowing through the resistors R113 and R123 changes in accordance with the change of the drain current of each of the PMOS transistors M111 and M121, the current flowing through the resistors R111 and R121 is kept constant. As a result, the potentials at the nodes D1 and D2 are kept constant at the voltage VC. For example, when the amount of current flowing through the resistor R113 decreases due to the change of the input signal voltage Vin, the decrease in the current is compensated for by increasing the drain current of the PMOS transistor M111, whereby the current flowing through the resistor R111 is kept constant. In this manner, the nodes D1 and D2 are fixed at the constant voltage with respect to the AC input signal voltage Vin, and thus serve as virtual ground points with respect to the input signal voltage Vin. Note that the potentials at the nodes D1 and D2 are kept at the voltage VC due to the effects of the imaginary short of the amplifier G101 and the setting of the voltage by an internal bias circuit.

The difference between the drain currents of the PMOS transistors M111 and M121 corresponds to the difference between the drain currents of the PMOS transistors M113 and M123 which are current-mirror connected. The drain currents of the PMOS transistors M113 and M123 correspond to the output currents Iout1 and Iout2, respectively. As a result, the current flowing through the resistors R113 and R123 corresponds to the difference between the output currents Iout1 and Iout2, and is output as a differential output current signal from the output terminals OUT101 and OUT102. Accordingly, if the tracking error of the feedback in the amplifier G101 and the PMOS transistors M111 and M121 is eliminated, a differential output current (Iout1-Iout2) becomes equal to a value (Vin/R) obtained by dividing the input signal voltage Vin by the resistance value R. As is obvious from this result, the magnitude of the differential output current signal (Iout1-Iout2) varies depending on the magnitude of the resistance value R of each of the resistors R113 and R123. Accordingly, the resistors R113 and R123 have a voltage/current conversion function of converting the input signal voltage Vin into the differential output current signal.

Figure 4:
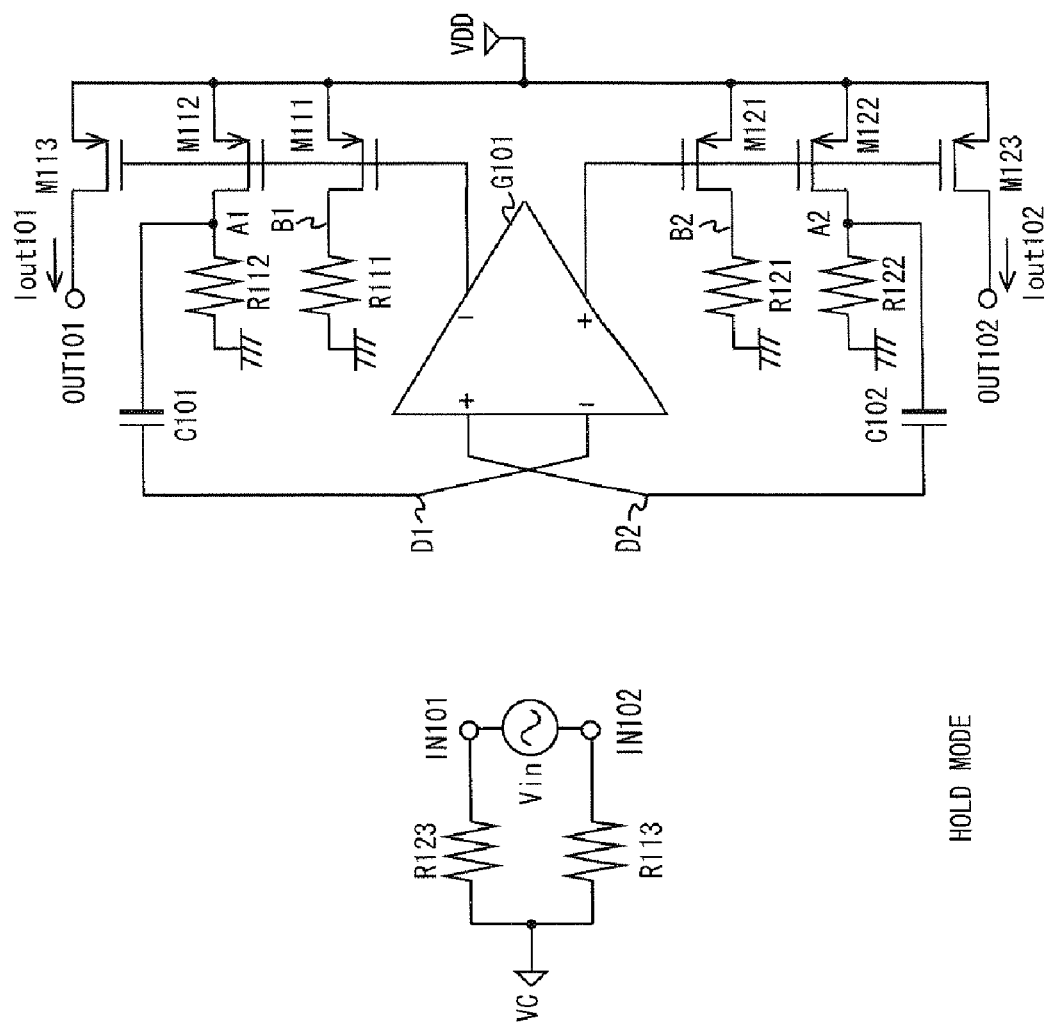
FIG. 4 is a diagram illustrating the configuration of the voltage/current conversion circuit according to the first exemplary embodiment in the hold mode.
Figure 5:
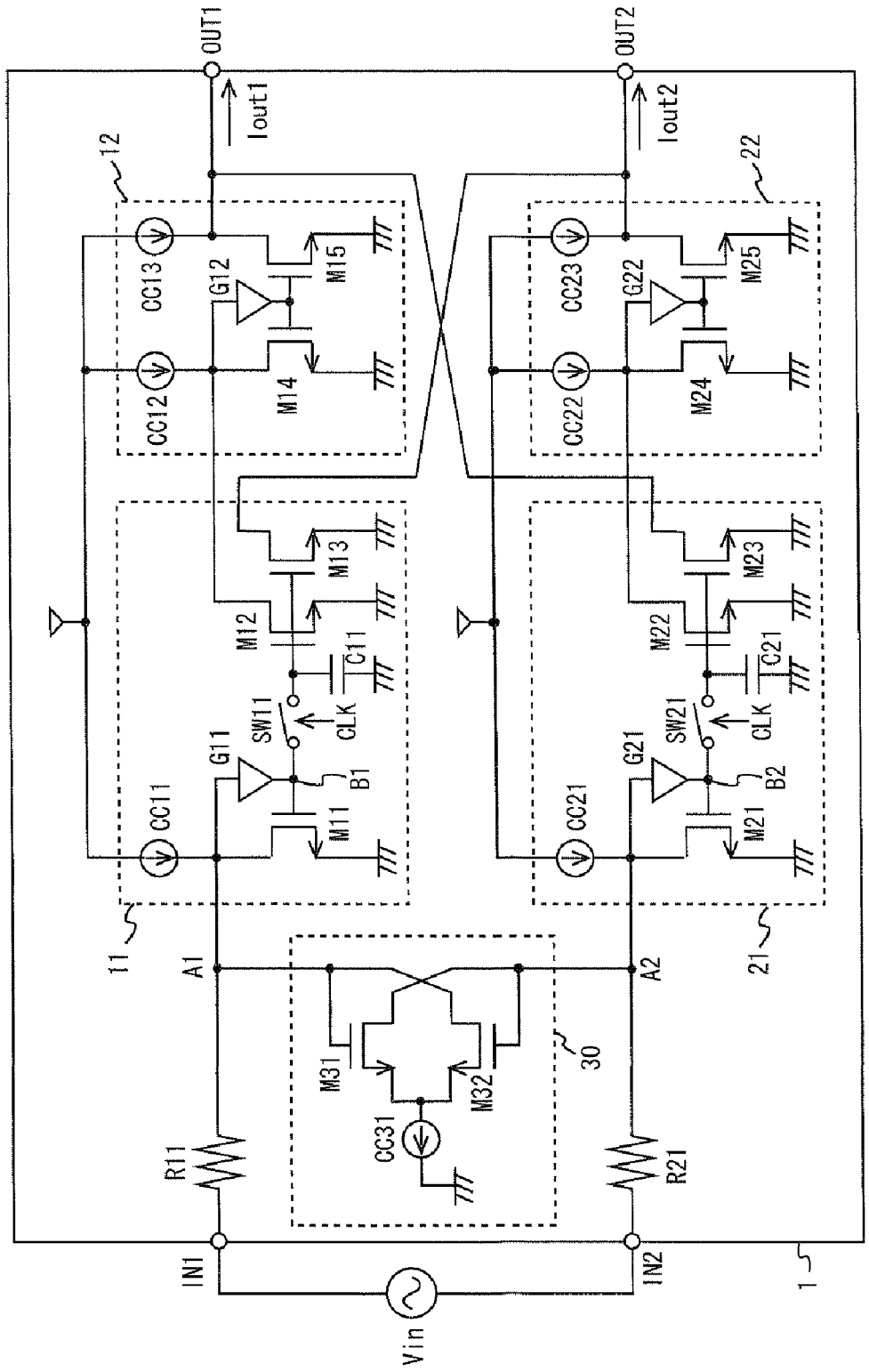
FIG. 5 shows the configuration of a voltage/current conversion circuit of the related art.
Figure 6:
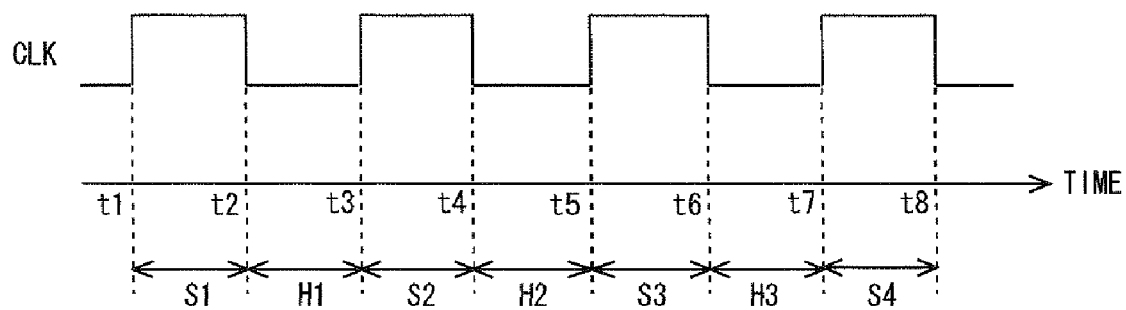
FIG. 6 shows the waveform of a clock signal input to each switch for causing the voltage/current conversion circuit of the related art to switch between the sampling mode and the hold mode.

Next, FIG. 4 shows the connection configuration of the voltage/current conversion circuit 100 in the hold mode, e.g., in the period H1 between the times t2 and t3, in which the illustration of the switches SW111 to SW114 and SW121 to SW124 is omitted. The switches SW114 and SW124 are in the OFF state, and thus the nodes B1 and D1 and the nodes B2 and D2 are disconnected. The terminals "a" and "c" of each of the switches SW111 to SW113 and SW121 to SW123 are connected to each other, thereby connecting the capacitor C101 between the nodes D1 and A1 and connecting the capacitor C102 between the node D2 and the node A2. Further, the resistor R113 is connected between the input terminal IN102 and the constant voltage supply terminal VC, and the resistor R123 is connected between the input terminal IN101 and the constant voltage supply terminal VC. Further, at the time t2 of FIG. 2, the input signal voltage Vin applied to the capacitors C101 and C102 is obtained as a sampling voltage Vins.

As is obvious from the connection configuration shown in FIG. 4, the amplifier G101 and the PMOS transistors M112 and M122 constitute a feedback circuit. Note that the capacitor C101 is connected between the nodes A1 and D1, and the capacitor C102 is connected between the nodes A2 and D2. Each of the capacitors C101 and C102 functions as a feedback capacitor connected to the amplifier G101. The capacitors C101 and C102 are charged with a voltage corresponding to the sampling voltage Vins obtained at the time t2.

In this case, currents corresponding to the potentials (½ Vins+VC and -½ Vins+VC) at the nodes A1 and A2, which are determined by the sampling voltage Vins and the voltage VC, flow through the resistors R112 and R122, respectively. In other words, assuming that the resistance value of each of the resistors R112 and 122 is denoted by "R", currents represented by (½ Vins+VC)/R and (−½ Vins+VC)/R flow through the resistors R112 and R122, respectively. These currents are equal in magnitude to the drain currents of the PMOS transistors M112 and M122. Accordingly, the resistors R112 and R122 have a function of carrying out the voltage/current conversion in the hold mode. The PMOS transistors M111 and M112 and the PMOS transistors M121 and M122 are current-mirror connected and have the same transistor size, and therefore, drain currents having the same value flow therethrough. Further, as described in the case of the sampling mode, the drain currents of the PMOS transistors M111 and M121 are in the differential relationship, and thus the drain currents of the PMOS transistors M112 and M122 are also in the differential relationship. Furthermore, the voltages applied to both ends of the capacitors C10 and C102 are in the differential relationship. Moreover, the resistors R112 and R122 have the same resistance value R as that of the resistors R112 and R122 that act as resistors for the voltage/current conversion in the sampling mode.

In this case, if the tracking error of the feedback in the amplifier G101 and the PMOS transistors M111 and M121 is eliminated, the drain currents flowing through the PMOS transistors M111 and M121 at the time of t2 are respectively equal to the sums of currents flowing through the resistors R113 and R123 (the currents having the same current value of Vins/2R and opposite flow directions), and currents having a value obtained by dividing the potential VC at the nodes D1 and D2 by the resistance value R of the resistors R111 and R121 (the currents having the same current value of VC/R and the same flow direction). In other words, if the resistance values R of the resistors R112 and R122 are the same and the resistance values R of the resistors R111 and R121 are also the same, the drain currents of the PMOS transistors M111 and M121 are substantially equal to those obtained in the hold mode.

In view of the above, the drain currents of the PMOS transistors M112 and M122 are kept constant during the hold mode at a current value corresponding to the voltage Vins applied to the capacitors C101 and C102. The difference between the drain currents of the PMOS transistors M112 and M122 corresponds to the difference between the output currents Iout1 and Iout2, and is output as a differential output current signal. The difference between the drain currents of the PMOS transistors M112 and M122 obtained at this time is equal to the value of the current flowing through the resistors R112 and R122 (each having the resistance value R) according to the difference between the voltages Vins applied to the capacitors C101 and C102. For this reason, the differential output current (Iout1-Iout2) has a value (Vins/R) obtained by dividing the input signal voltage Vins by the resistance value R. Thus, the differential output current signal holds the same value as that obtained at the time of t2 during the hold mode. Subsequently, the voltage/current conversion circuit 100 repeats the operations of the sampling mode and the hold mode as described above in response to the clock signal CLK.

Note that, during the hold mode, the signal source of the input signal is short-circuited in a closed circuit configuration with the resistors R113 and R123. This is because the impedance as viewed from the signal source of the input signal is set to be constant irrespective of the operation modes of the sampling mode and the hold mode.

In this regard, in the voltage/current conversion circuit 1 of the related art, the switch SW11 is disconnected during the hold mode. This means that the amplifiers G11 and G21 are incapable of performing voltage sampling on the sampling capacitors C11 and C21 during the hold mode. Thus, when the operation mode is switched to the sampling mode again, it is necessary for the amplifiers G11 and G21 to perform the voltage sampling by charging/discharging the sampling capacitors and to perform the voltage/current conversion within the accuracy required for a device, during the sampling mode. Accordingly, when the sampling frequency or the frequency of the input signal increases, the voltage/current conversion circuit 1 requires an amplifier for amplifying a high-frequency signal to complete settling within a sample-and-hold period. If an amplifier incapable of amplifying the high-frequency signal is used, it is impossible to complete settling within the sampling mode, and the voltage/current conversion circuit 1 is unable to output the output current signal with accuracy. In other words, a settling error occurring when the settling is not completed within the sampling mode is obtained as an error of the output current signal during the hold mode. Meanwhile, if an amplifier for amplifying the high-frequency signal is used, the amplifier requires high power consumption, which results in an undesirable increase in power consumption of the entire device.

On the other hand, in the voltage/current conversion circuit according to the first exemplary embodiment, the amplifier G101 is capable of correcting the setting error in the sampling mode, immediately after the hold mode is started. Accordingly, the amplifier G101 does not require to have an ability to provide a high accuracy of settling speed during the sampling mode.

The details thereof will be described below. Consideration is given to the case of sampling an input signal frequency of 10 MHz at a sampling frequency of 80 MHz with a 10-bit accuracy, for example. Assuming that the settling needs to be completed within the sampling period as in the case of the voltage/current conversion circuit 1 of the related art, the accuracy required for the amplifier G11 is extremely high, and a high-speed operation ability for completing the settling within 0.1% of the period of the sampling mode is required. Meanwhile, if the settling can be completed within the period of the hold mode as in the voltage/current conversion circuit 100 of this exemplary embodiment, it is sufficient to complete the settling within about one fourth of the period of the hold mode, depending on the use of the voltage/current conversion circuit 100.

Further, during the sampling mode, the voltage/current conversion circuit 100 carries out voltage sampling of the input signal voltage Vin with extremely high accuracy by using the capacitors C101 and C102 serving as sampling capacitors. The voltage sampling with high accuracy can be achieved, since the voltage sampling is performed not using any active element but using only the capacitors C101 and C102 serving as passive elements, unlike the voltage/current conversion circuit 1.

Furthermore, the voltage/current conversion circuit 100 carries out the voltage/current conversion to follow the input signal voltage Vin by using the resistors R113 and R123 and the amplifier G101. Thus, the output potential of the amplifier G101 immediately after the switching from the sampling mode to the hold mode is substantially equal to that immediately before the switching from the sampling mode to the hold mode. Accordingly, it is only necessary to correct an extremely small settling error due to a delay in following of the amplifier G101 that occurs immediately after the switching from the sampling mode to the hold mode. The potential difference generated due to the correction is much smaller than the potential difference generated due to a temporal change of the input signal voltage Vin, and is equal to a step voltage of about several tens of mV, for example, at the highest. This is because the voltage/current conversion carried out by the voltage/current conversion circuit 100 during the hold mode is based on a DC voltage applied to the capacitors C101 and C102. Thus, a time period required for the correction within the period of the hold mode, i.e., a required time period within the period of the hold mode is extremely short. For example, in the case of sampling an input signal frequency of 10 MHz at a sampling frequency of 80 MHz with a 10-bit accuracy, a design process 0.25 μm, a power supply voltage VDD of 1.5 V, and a power consumption of 2.8 mA, the required time period within the hold mode is about 3 nsec which is extremely short. For this reason, it is preferable that the amplifier G101 used for the voltage/current conversion circuit 100 have a high DC gain instead of a gain caused by a high-frequency signal. This permits the use of an amplifier having low power consumption and relatively low speed. Even when a high-frequency input signal is input, the power consumption of the voltage/current conversion circuit 100 is prevented from increasing.

In short, when the input signal frequency or the sampling frequency increases, the conventional circuits such as the voltage/current conversion circuit 1 require a current sampling circuit incorporating an amplifier having high power consumption, high speed, and high performance. Meanwhile, the voltage/current conversion circuit 100 of this exemplary embodiment is capable of performing voltage sampling using the capacitors C101 and C102 serving as passive elements having high speed and high accuracy, while performing voltage/current conversion using the amplifier G101 having a relatively slow operation speed. Therefore, the voltage/current conversion circuit 100 is capable of outputting the output current signal with accuracy in the hold mode, which leads to a reduction in power consumption.

Further, regarding the current mirror circuits at the output stage that most requires a dynamic range in the configuration of the voltage/current conversion circuit 100 of this exemplary embodiment, one end of each of load resistors, i.e., the resistors R111, R112, R121, and R122, is connected to the ground voltage terminal GND. Thus, when the differential input signal voltage Vin is a peak-to-peak voltage of 1 V, a change in potential at the other end of each of the load resistors falls within the range from 0.5 V to the ground voltage GND. Therefore, even allowing for an increased in potential caused by a bias current that is generated because the current mirror circuits are not cut off, the voltage/current conversion circuit 100 is operable at a low power supply voltage VDD of about 1.5 V.

Note that the present invention is not limited to the above exemplary embodiments, and various modifications can be made without departing from the scope of the present invention. For example, in the voltage/current conversion circuit 100 of the above-mentioned exemplary embodiment, the output points of the current mirror circuits are changed between the sampling mode and the hold mode. Specifically, during the sampling mode, the node B1 is connected to the node D1 and the node B2 is connected to the node D2. Further, during the hold mode, the node A1 is connected to one end of the capacitor C101, and the node A2 is connected to one end of the capacitor C102. This configuration is effective in reducing the effect of a parasitic capacitance included in the switches SW111, SW113, SW121, and SW123 and in reducing a settling time during the hold mode of the voltage/current conversion circuit 100.

In this case, if a certain increase in settling time during the hold mode and a certain reduction in operation speed of the voltage/current conversion circuit 100 are allowable, the PMOS transistors M112 and M122 and the resistors R112 and R122 may be omitted, and the output points may be connected in common with the drains of the PMOS transistors M111 and M121. In other words, the nodes B1 and B2 may be respectively connected to the terminals "c" of the switches SW111 and SW121. As a result, the number of elements constituting the voltage/current conversion circuit 100 can be reduced and the power consumption can also be reduced.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A voltage/current conversion circuit which outputs a differential output current signal corresponding to a potential difference between differential input signals respectively input to a first input terminal and a second input terminal, the voltage/current conversion circuit comprising:

a first capacitor and a second capacitor;

a first resistor having one terminal connected to the first input terminal;

a second resistor having one terminal connected to the second input terminal;

a first current source that outputs a current in response to a first control signal;

a second current source that outputs a current in response to a second control signal;

a first output terminal and a second output terminal that output currents respectively corresponding to the currents output from the first current source and the second current source;

a third resistor connected to an output of the first current source;

a fourth resistor connected to an output of the second current source;

a differential amplifier that outputs the first control signal and the second control signal for respectively controlling the currents output from the first current source and the second current source in accordance with a potential different between one input and the other input; and a control unit that performs a control such that:

in a first state, the first input terminal is connected to one terminal of the first capacitor; the second input terminal is connected to one terminal of the second capacitor; one input of the differential amplifier is connected to the other input terminal of the first resistor; the other input of the differential amplifier is connected to the other terminal of the second resistor; the output of the first current source is connected to the other input of the differential amplifier; and the output of the second current source is connected to the one input of the differential amplifier, and in a second state, the first capacitor is connected between the output of the first current source and the other input of the differential amplifier, and the second capacitor is connected between the output of the second current source and the one input of the differential amplifier.

2. The voltage/current conversion circuit according to claim 1, further comprising a constant voltage supply terminal for supplying a predetermined voltage, wherein in the first state, the one terminal of the first capacitor is connected to the first input terminal; the one terminal of the second capacitor is connected to the second input terminal; and the other terminal of each of the first capacitor and the second capacitor is connected to the constant voltage supply terminal, and in the second state, the other terminal of the first capacitor is connected to the other input of the differential amplifier; the one terminal of the first capacitor is connected to the output of the first current source; the other terminal of the second capacitor is connected to the one input of the differential amplifier; and the one terminal of the second capacitor is connected to the output of the second current source.

3. The voltage/current conversion circuit according to claim 2, wherein a voltage supplied from the constant voltage supply terminal corresponds to a midpoint potential between the differential input signals respectively input to the first input terminal and the second input terminal.

4. The voltage/current conversion circuit according to claim 2, wherein, in the second state, the first resistor is connected between the first input terminal and the constant voltage supply terminal, and the second resistor is connected between the second input terminal and the constant voltage supply terminal.

5. The voltage/current conversion circuit according to claim 1, wherein
the first current source comprises a first transistor,
the second current source comprises a second transistor,
the first transistor is connected between a power supply voltage terminal and the third resistor, and has a control terminal that receives the first control signal, and
the second transistor is connected between the power supply voltage terminal and the fourth resistor, and has a control terminal that receives the second control signal.

6. The voltage/current conversion circuit according to claim 5, further comprising a third transistor current-mirror connected to the first transistor, and a fourth transistor current-mirror connected to the second transistor, wherein
the third transistor current-mirror is connected between the power supply voltage terminal and the first output terminal, and has a control terminal that receives the first control signal, and
the fourth transistor current-mirror is connected between the power supply voltage terminal and the second output terminal, and has a control terminal that receives the second control signal.

7. The voltage/current conversion circuit according to claim 1, wherein the first to fourth resistors have the same resistance value.

8. The voltage/current conversion circuit according to claim 1, further comprising a fifth resistor and a sixth resistor, wherein
the first current source comprises a first transistor and a fifth transistor,
the second current source comprises a second transistor and a sixth transistor,
the first transistor is connected between the power supply voltage terminal and the third resistor, and has a control terminal that receives the first control signal,
the second transistor is connected between the power supply voltage terminal and the fourth resistor, and has a control terminal that receives the second control signal,
the fifth transistor is connected between the power supply voltage terminal and the fifth resistor, and has a control terminal that receives the first control signal, and
the sixth transistor is connected between the power supply voltage terminal and the sixth resistor, and has a control terminal that receives the second control signal.

9. The voltage/current conversion circuit according to claim 8, wherein
in the first state, a connection node between the first transistor and the third resistor is connected to the other input of the differential amplifier, and a connection node between the second transistor and the fourth resistor is connected to the one input of the differential amplifier, and
in the second state, the first capacitor is connected between a connection node between the fifth transistor and the fifth resistor and the other input of the differential amplifier, and the second capacitor is connected between a connection node between the sixth transistor and the sixth resistor and the one input of the differential amplifier.

10. The voltage/current conversion circuit according to claim 8, further comprising a third transistor current-mirror connected to the first transistor and the fifth transistor, and a fourth transistor current-mirror connected to the second transistor and the sixth transistor, wherein
the third transistor current-mirror is connected between the power supply voltage terminal and the first output terminal, and has a control terminal that receives the first control signal, and
the fourth transistor current-mirror is connected between the power supply voltage terminal and the second output terminal, and has a control terminal that receives the second control signal.

11. The voltage/current conversion circuit according to claim 8, wherein the first to sixth resistors have the same resistance value.

12. The voltage/current conversion circuit according to claim 1, wherein
the first state indicates a sampling mode, and
the second state indicates a hold mode.

* * * * *